US 7,429,524 B2

(12) United States Patent
Marshall et al.

(10) Patent No.: US 7,429,524 B2
(45) Date of Patent: Sep. 30, 2008

(54) TRANSISTOR DESIGN SELF-ALIGNED TO CONTACT

(75) Inventors: Andrew Marshall, Dallas, TX (US); Tito Gelsomini, Plano, TX (US); Harvey Edd Davis, Trenton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 217 days.

(21) Appl. No.: 11/225,992

(22) Filed: Sep. 14, 2005

(65) Prior Publication Data

US 2007/0059908 A1 Mar. 15, 2007

(51) Int. Cl.
*H01L 21/3205* (2006.01)
*H01L 21/4763* (2006.01)
(52) U.S. Cl. .................. 438/585; 438/618; 438/279
(58) Field of Classification Search ................ 438/585, 438/392, 618
See application file for complete search history.

(56) References Cited

U.S. PATENT DOCUMENTS

| 5,817,563 | A * | 10/1998 | Lim ........................... 438/307 |
| 6,248,637 | B1 * | 6/2001 | Yu .............................. 438/300 |
| 6,326,270 | B1 * | 12/2001 | Lee et al. .................... 438/279 |
| 6,693,331 | B2 * | 2/2004 | Mistry et al. ............... 257/369 |
| 6,730,566 | B2 | 5/2004 | Niimi et al. |
| 7,026,691 | B1 * | 4/2006 | Sander et al. ............... 257/382 |
| 7,202,180 | B2 * | 4/2007 | Koh et al. ................... 438/740 |
| 2003/0107133 | A1 | 6/2003 | Tomita |
| 2004/0195608 | A1 * | 10/2004 | Kim et al. ................... 257/296 |
| 2004/0228068 | A1 * | 11/2004 | Banerjee et al. .......... 361/306.3 |
| 2004/0256676 | A1 | 12/2004 | Hirotsu et al. |
| 2005/0118798 | A1 * | 6/2005 | Kim et al. ................... 438/618 |
| 2006/0285374 | A1 * | 12/2006 | Szeto et al. .................... 365/49 |

OTHER PUBLICATIONS

Van Zant, P. 'Microchip fabrication: a practical guide to semiconductor processing,' 4th ed. New York, McGraw-Hill, 2000, ISBN 0071356363. Fig. 10.23 on p. 304, Fig. 13.5 on p. 402 and Fig. 16.21 on p. 513.

* cited by examiner

*Primary Examiner*—Lex Malsawma
*Assistant Examiner*—Eric W Jones
(74) *Attorney, Agent, or Firm*—Frederick J. Telecky, Jr.; Wade J. Brady, III

(57) ABSTRACT

The present invention provides a method of manufacturing a transistor device, a transistor device, and a method for manufacturing an integrated circuit. In one aspect, the method of manufacturing a transistor device includes providing a gate structure (140) over a substrate (110). An insulating layer (310) is formed over the gate structure (140), and openings (710) to the substrate (110) are formed therein, thereby removing a portion of the gate structure (140). The openings (710) are filled with a conductor (1410), thereby forming an interconnect (1510).

12 Claims, 18 Drawing Sheets

TRANSISTOR DESIGN SELF-ALIGNED TO CONTACT

TECHNICAL FIELD OF THE INVENTION

The present invention is directed, in general, to a method of forming a transistor device, and in particular, a method of forming a transistor device in which contacts to the transistor are self-aligned to the transistor gate.

BACKGROUND OF THE INVENTION

The trend in semiconductor technology to double the functional complexity of its products every 18 months (Moore's "law"), which is still valid today after having dominated the industry for the last three decades, has several implicit consequences. First, the cost per functional unit should drop with each generation of complexity so that the cost of the product with its doubled functionality would increase only slightly. Second, the higher product complexity should largely be achieved by shrinking the feature sizes of the chip components while holding the package dimensions constant; preferably, even the packages should shrink. Third, the increased functional complexity should be paralleled by an equivalent increase in reliability of the product. And fourth, but not least, the best financial profit rewards were held out for the ones who were ahead in the marketplace in reaching the complexity goal together with offering the most flexible products for application.

One area of integrated circuit manufacturing technology that poses difficulties in continued miniaturization and cost reduction is that of making electrical contact to a transistor device. The manufacturing process utilizes multiple patterning levels that require aligning a photolithographic mask with lower levels in the fabrication sequence. In the case of MOS transistors, conventional manufacturing practice requires aligning the vertical conductors that make contact with the transistor (appropriately referred to as "contacts") with the source and drain regions of the transistor. Conventional MOS transistors use a spacer on the gate electrode sidewall. Because of alignment tolerances, space must be designed between the sidewall spacer and the contact so that when maximum misalignment occurs, the contact does not hit the sidewall spacer. When the contact does hit the spacer, the area of electrically conductive contact to the substrate is reduced, leading to increased resistance of the contact and resulting yield fallout. Thus, there are competing factors to be balanced by the manufacturer: maximum density of transistor devices, but adequate design distance between the contact and sidewall spacer to minimize yield fallout.

A second concern to the manufacturer is the cost associated with pattering levels in the manufacturing process. With state-of-the-art transistor gate lengths targeting about 100 nm, each photolithographic mask using minimum geometry may cost as much as $100,000. When the cost of prototype designs is included in the total cost of a semiconductor product, the cost of multiple revisions, each requiring several minimum geometry masks, can be significant.

Consequently, what is needed in the semiconductor arts is a method of manufacturing a transistor device that overcomes the limitations of currently known manufacturing methods.

SUMMARY OF THE INVENTION

To address the above-discussed deficiencies of the prior art, the present invention provides a method for manufacturing a transistor device. The method includes providing a gate structure over a substrate and forming an insulating layer over the gate structure. An opening is formed in the insulating layer to the substrate, thereby removing a portion of the gate structure. The method additionally provides for filling the opening with a conducting material to form an interconnect.

In another aspect, the present invention provides a transistor device having a gate structure including a gate electrode and a gate dielectric. The gate dielectric is located between the gate electrode and a substrate. The transistor has a spacer layer substantially conforming to a sidewall of the gate structure. An interconnect extending through an insulating layer located over the gate structure contacts the substrate, and is in direct contact with the spacer layer.

In yet another aspect, the present invention provides a method for manufacturing an integrated circuit. The method includes forming transistor devices over a substrate, where the method of forming transistor devices includes providing gate structures over a substrate and forming an insulating layer over the gate structures. Openings are formed in the insulating layer to the substrate, thereby removing a portion of the gate structures, and are filled with a conducting material to form interconnects. The method further includes fabricating interlevel dielectric layers over the transistor devices, with the interlevel dielectric layers having conductive features formed therein for contacting the transistor devices and forming an operational integrated circuit.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

In the following FIGUREs, a sectional view of a transistor device 100 fabricated according to the principles is presented. When the goal of clarity is served, a plan view is also shown, including outlines of underlying structures to clarify the positional relationships of the elements of the transistor device 100 during manufacture. Furthermore, an additional sectional view taken at another position on the transistor device 100 may also be presented when appropriate.

Figure 1A:
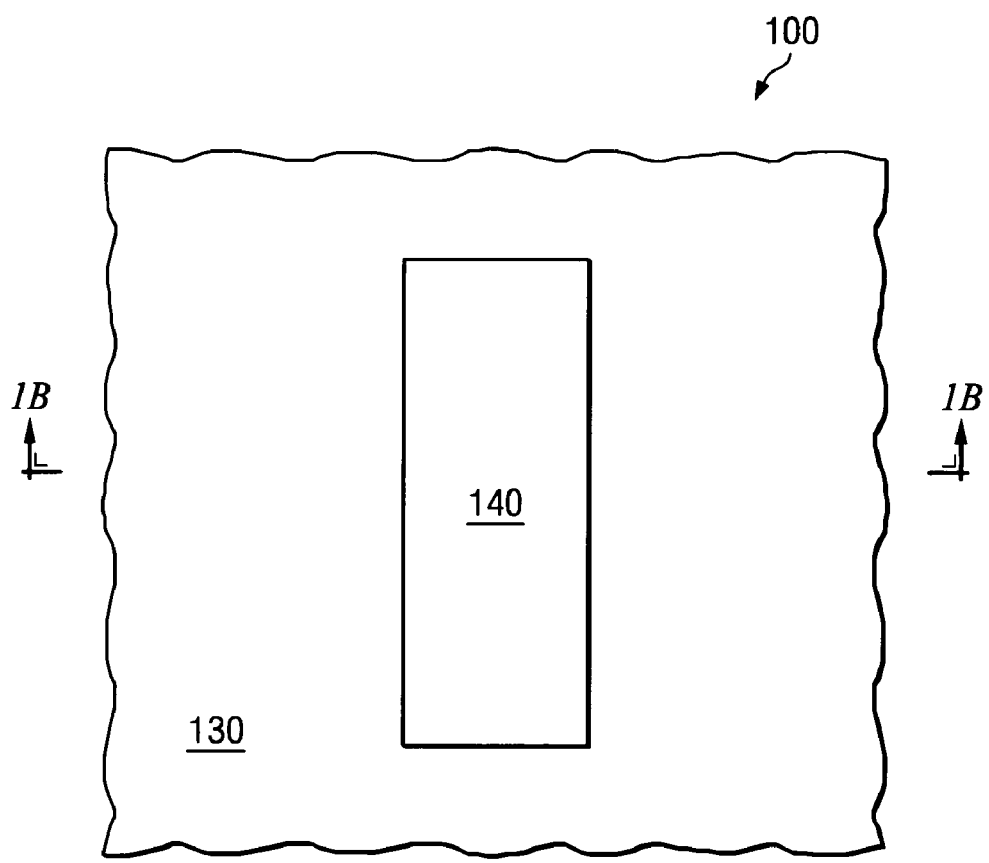
FIGS. 1A and 1B illustrate a plan view and a sectional view, respectively, of a partially completed transistor device fabricated according to the principles of the invention, after patterning a photoresist level with a gate structure pattern.
Figure 1B:
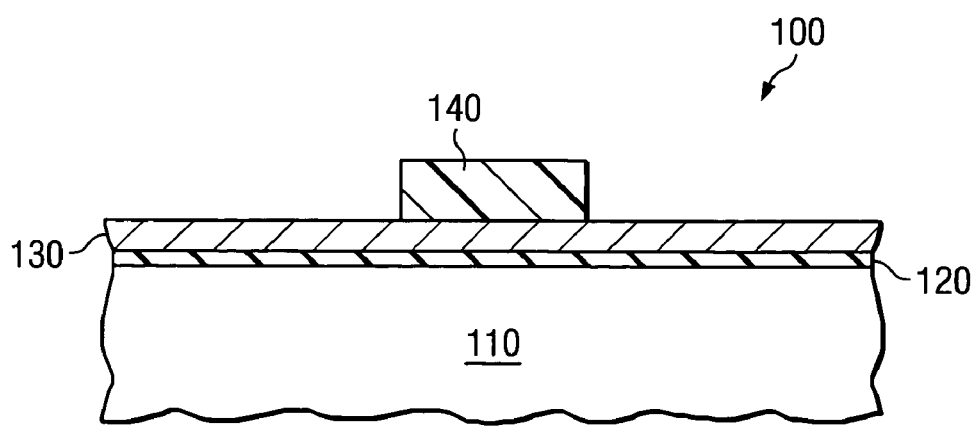

Referring initially to FIGS. 1A and 1B, illustrated are a plan view and a sectional view, respectively, of a partially completed transistor device 100 fabricated according to the principles of the invention. The transistor device 100 is fabricated on a substrate 110. The substrate 110 may be a conventional semiconductor, and may further be a semiconductor wafer suitable for semiconductor device manufacturing. An example of such a wafer is a 200 mm or 300 mm silicon wafer. Those skilled in the art will appreciate that such substrates are available with many possible variations, including the semiconducting material (e.g., Si and GaAs), dopant concentration, silicon-on-insulator, and substrates upon which an epitaxial layer has been formed. Moreover, the substrate 110 may have been processed to provide a number of structural features and layers as part of an incomplete device manufacturing flow, such as isolation structures (not shown). Moreover, the substrate 110 may have been previously processed by implantation of dopants to define NMOS and PMOS regions of the substrate 110. These and other similar variations in substrate type are all within the scope of the present invention.

A gate dielectric layer 120 has been formed on the substrate 110 by conventional means. Embodiments of the gate dielectric layer 120 include silicon dioxide, or any of the class of dielectrics known as "high-k" dielectrics. Such dielectrics may comprise refractory metals or silicates, or may be treated to raise the dielectric constant by incorporation of nitrogen. These and other variants of the gate dielectric layer 120 are within the scope of the invention, and are well known to those skilled in the art of semiconductor manufacture.

A conventional gate electrode layer 130 has been formed over the gate dielectric layer 120. Materials and processes suitable for the formation of the gate electrode layer 130 are also well known in the art. Such materials may include polysilicon or any of the class of "metal gate" materials. A photoresist layer has been formed over the gate electrode layer 130 and patterned by conventional means to define a gate pattern 140 to be transferred to the underlying layers. The gate pattern 140 may be any pattern suitable for the formation of the transistor device 100 using the principles of the invention, and is shown as a rectangle for simplicity of illustration in the pictured embodiment.

Figure 2A:
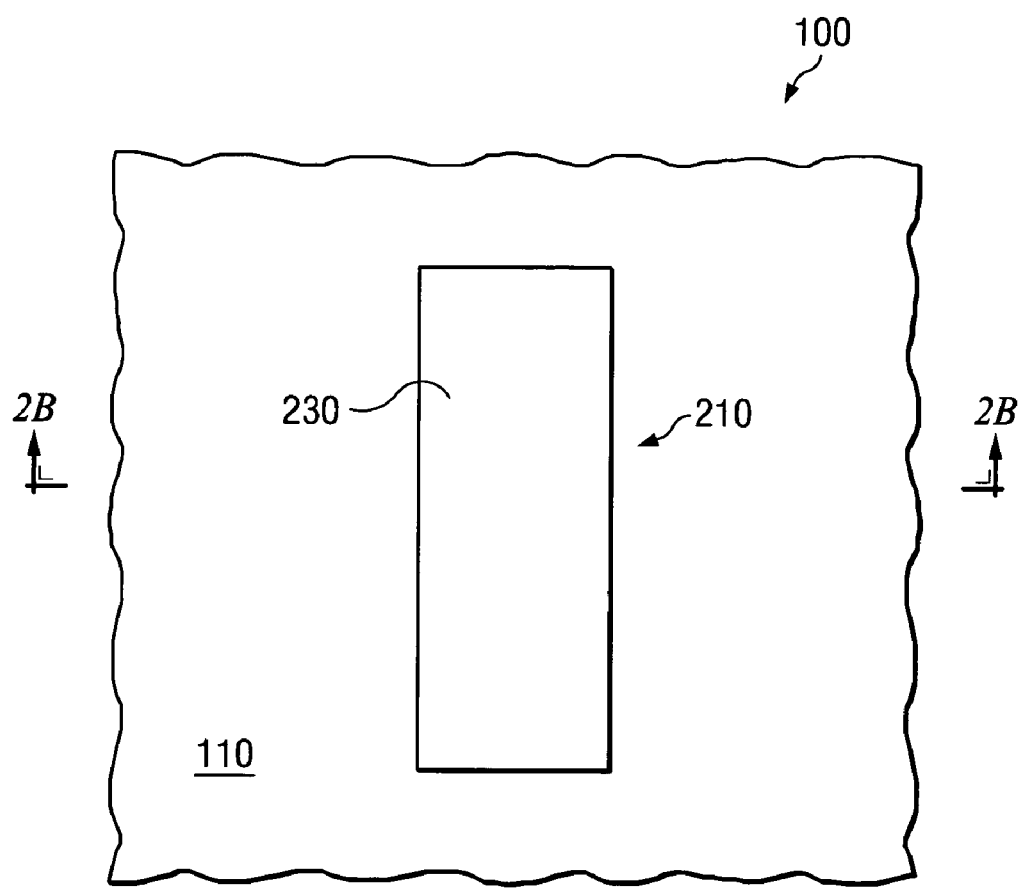
FIGS. 2A and 2B, illustrate a plan view and a sectional view, respectively, of the partially completed transistor device illustrated in FIGS. 1A and 1B, respectively, after the gate pattern has been transferred to the gate dielectric layer and the gate electrode layer to form a partially patterned gate structure.
Figure 2B:
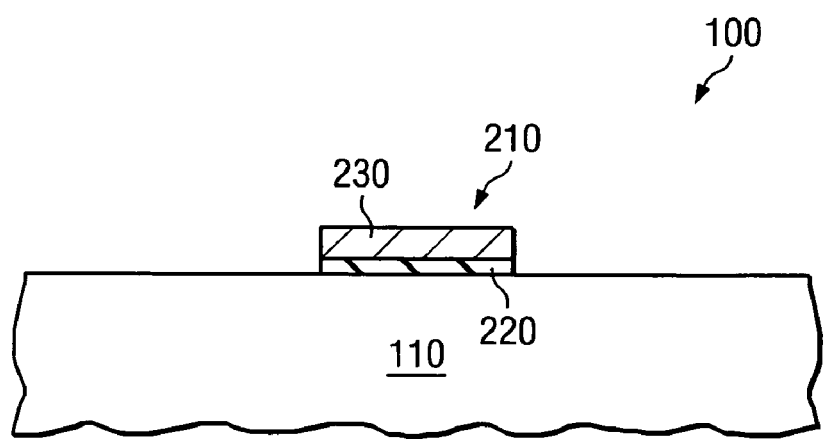

Turning now to FIGS. 2A and 2B, illustrated are a plan view and a sectional view, respectively, of the partially completed transistor device 100 illustrated in FIGS. 1A and 1B after the gate pattern 140 has been transferred to the gate dielectric layer 120 and the gate electrode layer 130 to form a partially patterned gate structure 210. The partially patterned gate structure 210 comprises a partially patterned gate dielectric 220 and a partially patterned gate electrode 230. The pattern transfer is done using conventional means, and may be a plasma etch process. Such processes are well known in the art. One of ordinary skill in the art will appreciate that the details of a suitable plasma process will depend on the particular selection of materials for the gate dielectric layer 120 and the gate electrode layer 130. In general, it is preferable that the removal process remove the gate dielectric layer 120 at a relatively faster rate than the substrate 110 to facilitate process control and the ability to stop on the substrate 110.

Figure 3A:
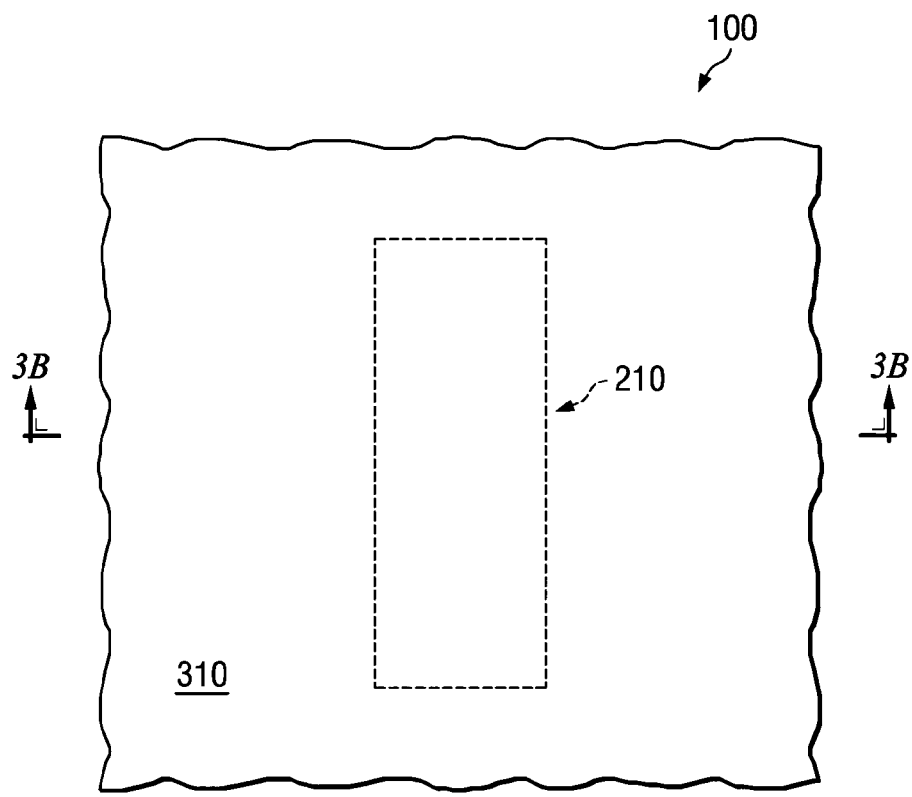
FIGS. 3A and 3B illustrate a plan view and a sectional view, respectively, of the partially completed transistor device illustrated in FIGS. 2A and 2B, after formation of an interlevel dielectric over the partially patterned gate structure and the substrate.
Figure 3B:
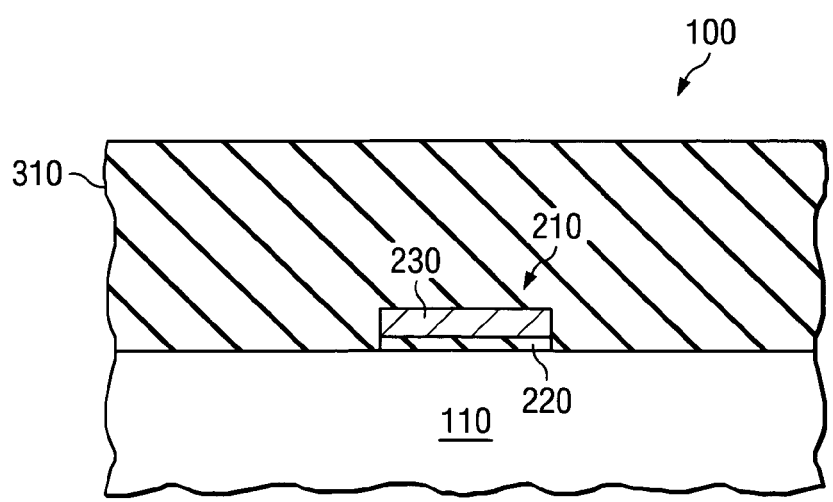

Turning now to FIGS. 3A and 3B, illustrated are a plan view and a sectional view, respectively, of the partially completed transistor device 100 illustrated in FIGS. 2A and 2B after formation of an interlevel dielectric 310 over the partially patterned gate structure 210 and the substrate 110. The interlevel dielectric 310 may be formed conventionally, and may further be silicon dioxide deposited by a plasma CVD process. The interlevel dielectric 310 may also be doped with beneficial impurity atoms, such as phosphorus, to getter undesirable impurities such as sodium. While the surface of the interlevel dielectric 310 is shown as planar, the presence of the partially patterned gate structure 210 may result in undesirable surface topography. If desired, a planarization operation such as chemical mechanical planarization (CMP) may optionally be performed after deposition of the interlevel dielectric 310 to achieve desired planarity of the surface thereof. Those skilled in the art are familiar with such processes.

Figure 4A:
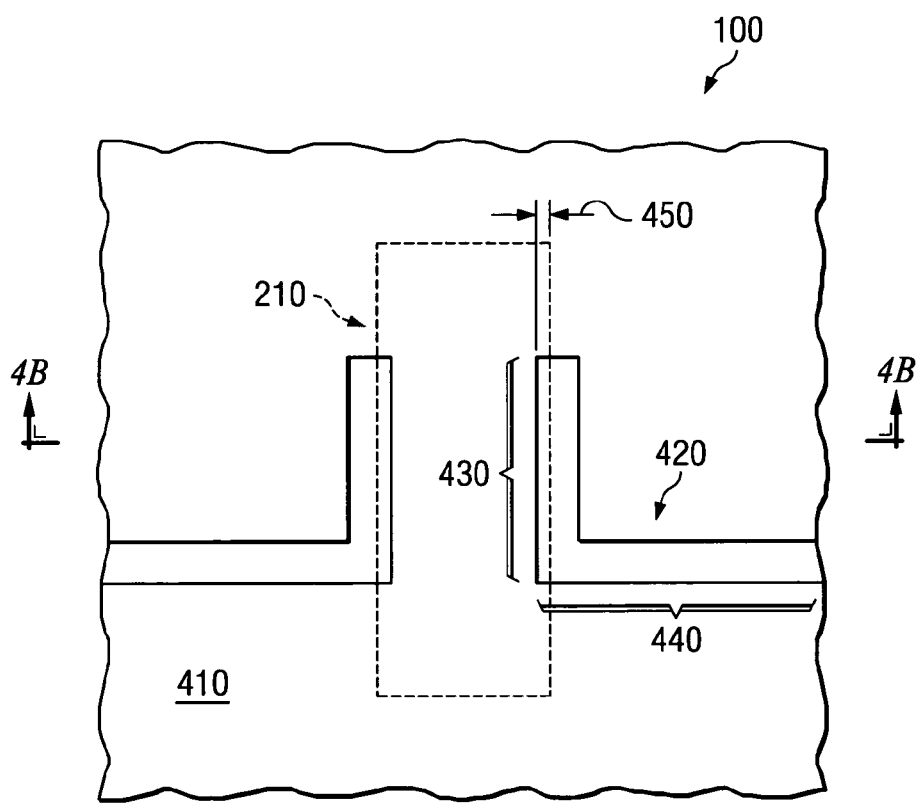
FIGS. 4A and 4B illustrate a plan view and sectional view, respectively, of the partially completed transistor device illustrated in FIGS. 3A and 3B, after forming and patterning a first photoresist layer with an interconnect pattern.
Figure 4B:
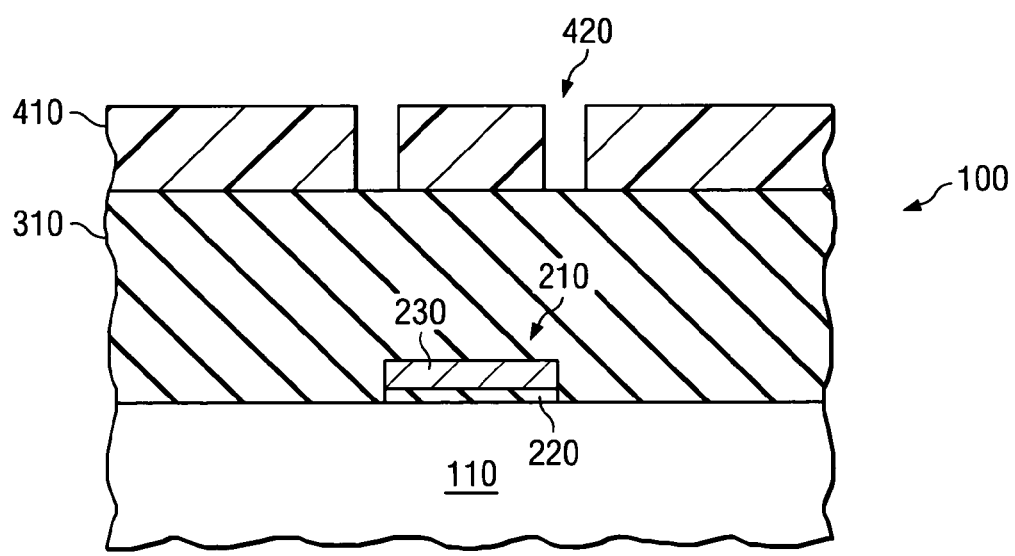

Turning now to FIGS. 4A and 4B, illustrated are a plan view and a sectional view, respectively, of the partially completed transistor device 100 illustrated in FIGS. 3A and 3B after forming and patterning a first photoresist layer 410 with an interconnect pattern 420. Each illustrated interconnect pattern 420 can be viewed as comprising a parallel segment 430 that has a long axis parallel to the long axis of the partially patterned gate structure 210, and an anti-parallel segment 440, that has an arbitrary direction with respect to the partially patterned gate structure 210. In the embodiment shown in FIG. 4A, the anti-parallel segment 440 is normal to the long axis of the partially patterned gate structure 210. The parallel segment 430 may be associated with the formation of a contact to the substrate 110 at a later stage of processing. The anti-parallel segment 440, however, may be associated with vertical interconnects (vias) formed in a later stage of processing, or may run directly to neighboring semiconductor devices (not shown) in a functioning integrated circuit. Thus, the anti-parallel segment 440 may be any geometry necessary to conform to the design of the larger circuit of which the transistor device 100 is a part.

Figure 5A:
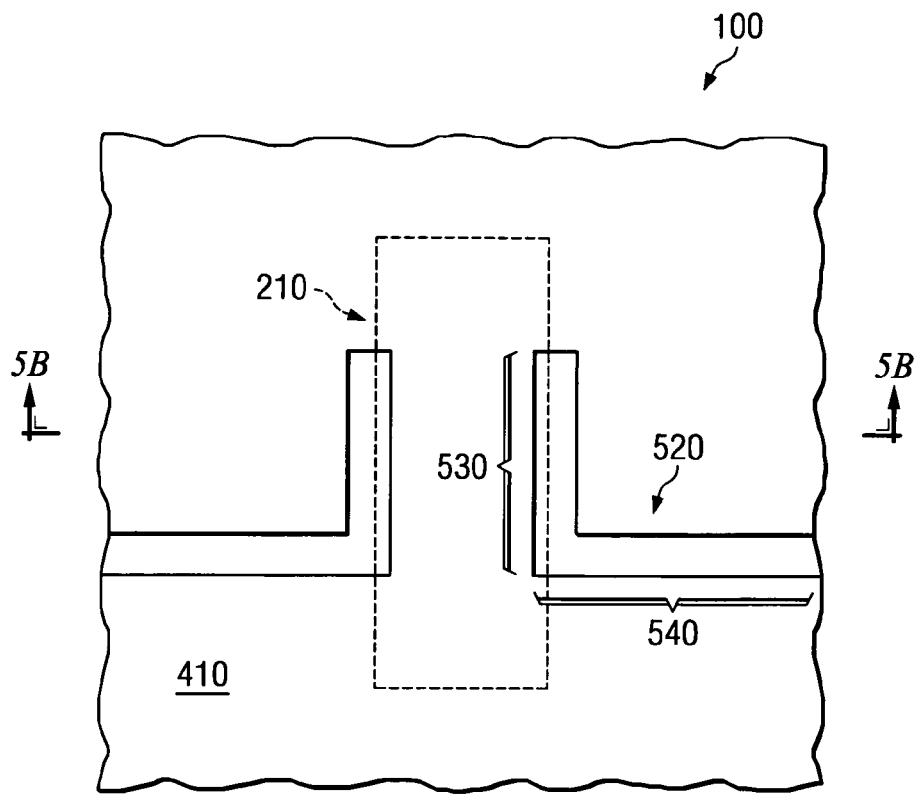
FIGS. 5A and 5B illustrate a plan view and sectional view, respectively, of the partially completed transistor device illustrated in FIGS. 4A and 4B, after a first etch process.
Figure 5B:
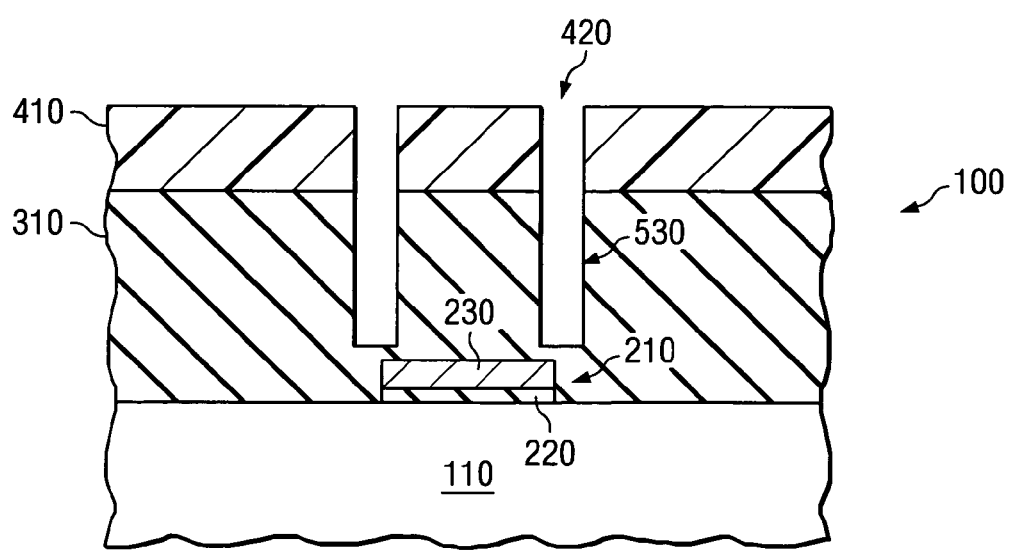

Turning now to FIGS. 5A and 5B, illustrated are a plan view and a sectional view, respectively, of the partially completed transistor device 100 illustrated in FIGS. 4A and 4B after a first etch process. Dielectric openings 520 have been formed by removing a portion of the interlevel dielectric 310 exposed by the interconnect pattern 420. The removing may be done using a conventional plasma etch process. In this embodiment, the etch process is preferably designed such that the bottom of each dielectric opening 520 is above the level of the partially patterned gate structure 210. In the same manner that the parallel segment 430 and the anti-parallel segment 440 of the interconnect pattern 420 were defined previously, a parallel segment 530 and an anti-parallel segment 540 of the dielectric openings 520 are defined as illustrated in FIG. 5A. After forming the dielectric openings 520, the first photoresist layer 410 may be removed by a conventional plasma ash process.

Figure 6A:
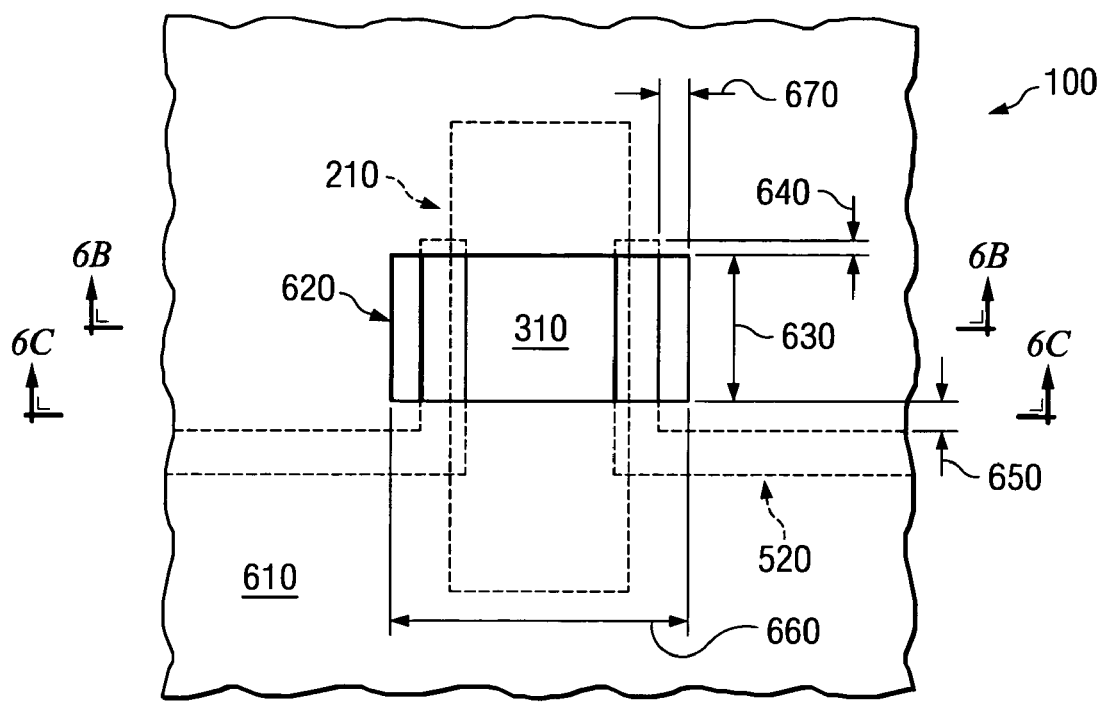
FIGS. 6A through 6C illustrate a plan view and sectional views of the partially completed transistor device illustrated in FIGS. 5A and 5B, after forming and patterning a second photoresist layer with a contact/implant box.
Figure 6B:
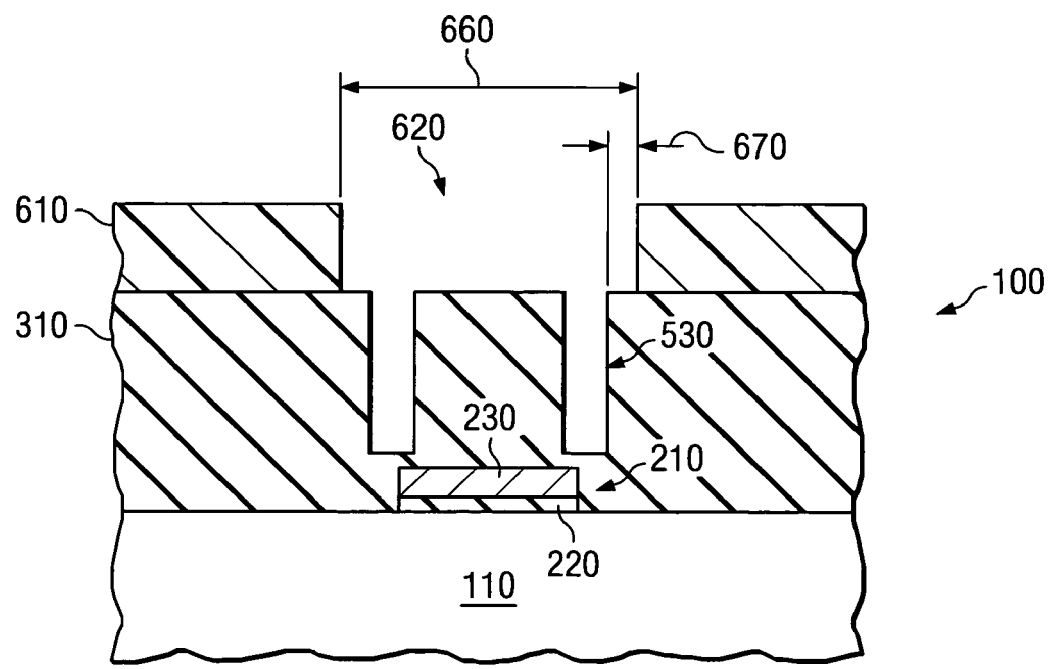
Figure 6C:
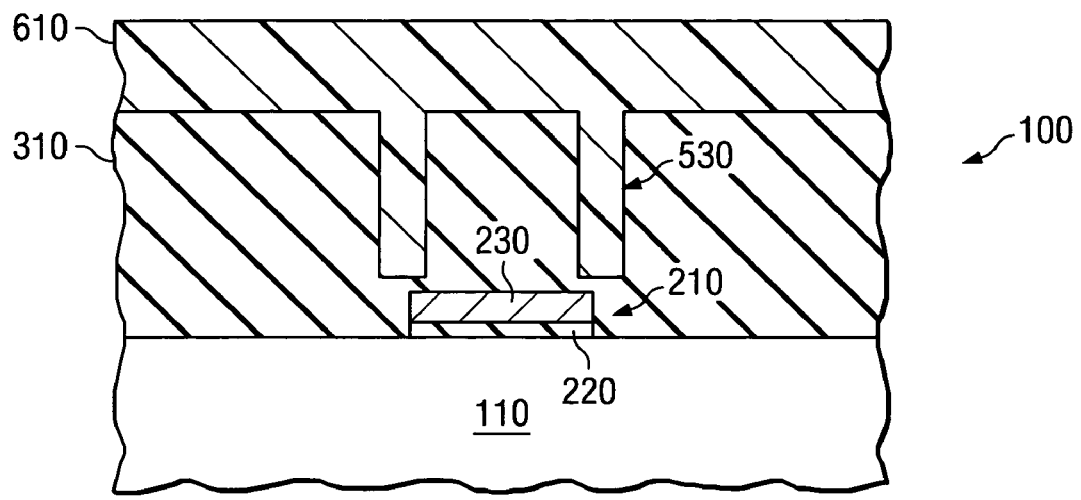

Turning now to FIGS. 6A through 6C, illustrated are a plan view and sectional views of the partially completed transistor device 100 illustrated in FIGS. 5A and 5B after forming and patterning a second photoresist layer 610 with a contact/implant box 620. The sectional view of FIG. 6B is taken through the parallel segment 530 underlying the contact/implant box 620, and the sectional view of FIG. 6C is taken through the parallel segment 530 outside the contact/implant box 620. The contact/implant box 620 provides an opening in the second photoresist layer 610 through which to remove a portion of the interlevel dielectric 310 and the partially patterned gate structure 210 at a later stage of processing. A width 630 of the contact/implant box 620 may advantageously determine the gate width of the transistor device 100 when a portion of the partially patterned gate structure 210 is removed.

The contact/implant box 620 is positioned relative to the parallel segment 530 of the dielectric opening 520 to ensure that a nonzero top overlap 640 and nonzero bottom overlap 650 are preserved. By designing the top overlap 640 and the bottom overlap 650 appropriately, the alignment of the contact/implant box 620 to the parallel segment 530 may advantageously be performed on a photolithographic tool that is only capable of relatively coarse alignment between pattern levels. Those skilled in the art of semiconductor processing will appreciate that the minimum values of the top overlap 640 and the bottom overlap 650 will be determined in part by the alignment capability of the photolithographic tool used to pattern the contact/implant box 620.

A length 660 of the contact/implant box 620 may also be determined in part by the aforementioned alignment capability of the photolithographic tool. As was determined for the width 630, the minimum length 660 of the contact/implant box 620 may be determined in a manner to ensure that an overlap 670 of the contact/implant box 620 relative to the parallel segment 530 is nonzero. An additional factor that may be considered is any requirement of a dopant implantation step to be performed at a later stage of processing. This latter issue will be discussed in the context of FIG. 9.

Finally, in FIG. 6C, portions of the parallel segment 530 that do not underlie the contact/implant box 620 are protected by photoresist. Thus, only those portions of the parallel segment 530 open to the contact/implant box 620 will be exposed to an etch process in a later stage of manufacture.

Figure 7A:
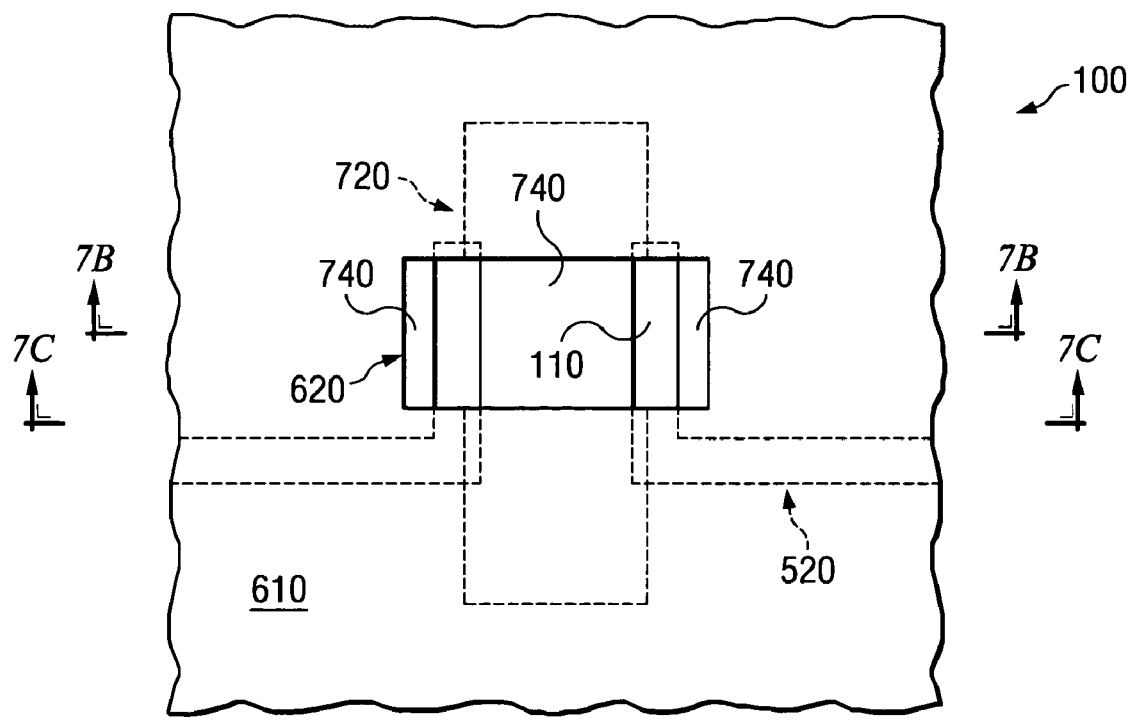
FIGS. 7A through 7C illustrate a plan view and sectional views of the partially completed transistor device illustrated in FIGS. 6A through 6C, respectively, after a second etch process.
Figure 7B:
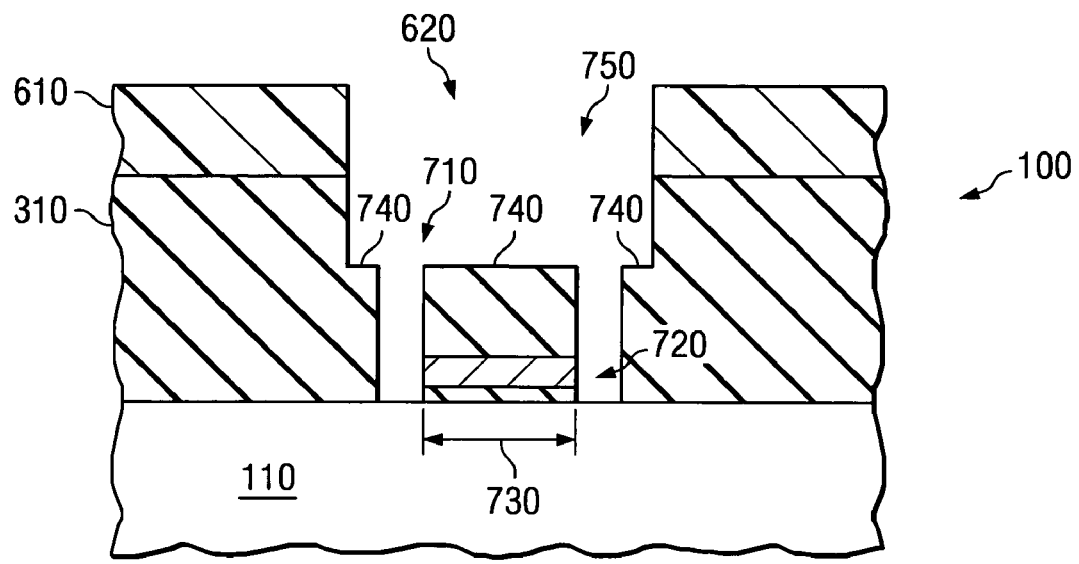
Figure 7C:
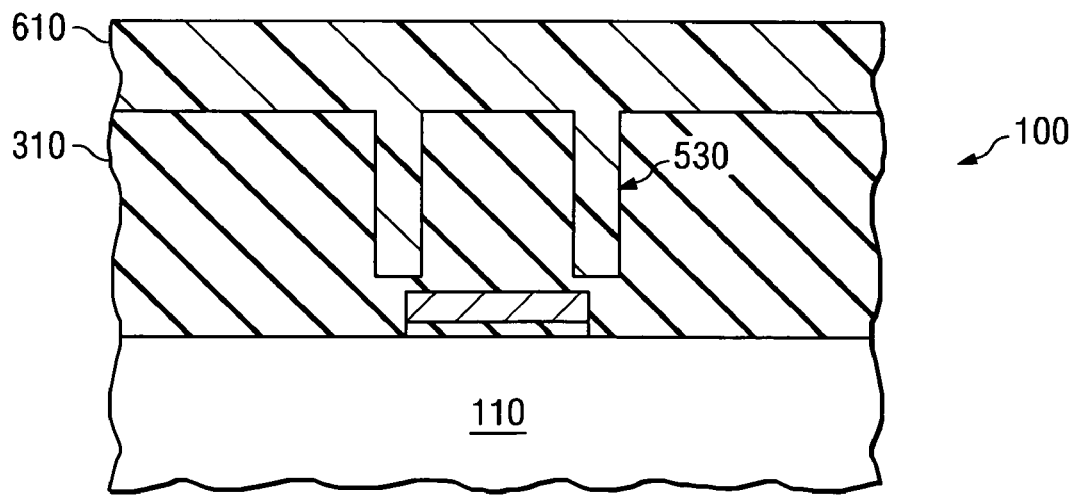

Turning to FIGS. 7A through 7C, with continued reference to FIG. 6B, illustrated are a plan view and sectional views of the partially completed transistor device 100 illustrated in FIGS. 6A through 6C, respectively, after a second etch process. A portion of the interlevel dielectric 310 and the partially patterned gate structure 210 exposed by the contact/implant box 620 has been removed to form contact openings 710. This removal may be done by a conventional plasma etch process. The etch process is preferably designed to result in the approximately simultaneous exposure of those portions of the substrate 110 underlying the portions of the parallel segment 530 exposed by the contact/implant box 620. In this way, all portions of the substrate 110 exposed by the removal of the dielectric 320 are exposed to the plasma process for about the same period of time. It is also preferable that for that period of the etch process when a portion of the partially patterned gate dielectric 220 is being removed, that the rate of removal of the partially patterned gate dielectric 220 and the interlevel dielectric 310 is relatively higher than the rate of removal of the substrate 110. This relative removal rate provides process control when stopping the etch after the substrate 110 is exposed. Those skilled in the art of semiconductor etch processing will appreciate that such an etch process may require multiple steps to provide these preferred characteristics.

The removal of a portion of the partially patterned gate electrode 230 and the partially patterned gate dielectric 220 results in a patterned gate structure 720 having an I-beam shape. This removing has the advantageous result of trimming the partially patterned gate structure 210 to set a gate length 730 of the transistor device 100. The contact openings 710 are then self-aligned to the patterned gate structure 730 by virtue of this trimming. This self-alignment of the contact openings 710 to the patterned gate structure 730 may result in a smaller space requirement of the completed transistor device 100, as discussed further below.

A portion 740 of the interlevel dielectric 310 exposed by the contact/implant box 620, but not within the parallel segment 530, is also exposed to the etch process, and a portion thereof is removed by the etch process to produce an upper opening 750. Thus, the height of the interlevel dielectric 310 above the substrate is reduced. Within the contact/implant box 620, this reduction of height has the effect of reducing the aspect ratio of the contact openings 710, which may be advantageous during source/drain dopant implantation at a later stage of processing. One skilled in the art will appreciate that the thickness of the dielectric 310 and the amount of the dielectric 310 removed by the etch process may be chosen to produce the desired geometries of the intermediate structure illustrated by FIGS. 7A through 7C, and thereby of the completed transistor device 100. It is noted, as illustrated in FIG. 7C, that those portions of the parallel segment 530 and the anti-parallel segment 540 protected by the second photoresist layer 610 are not affected by this stage of processing.

Figure 8A:
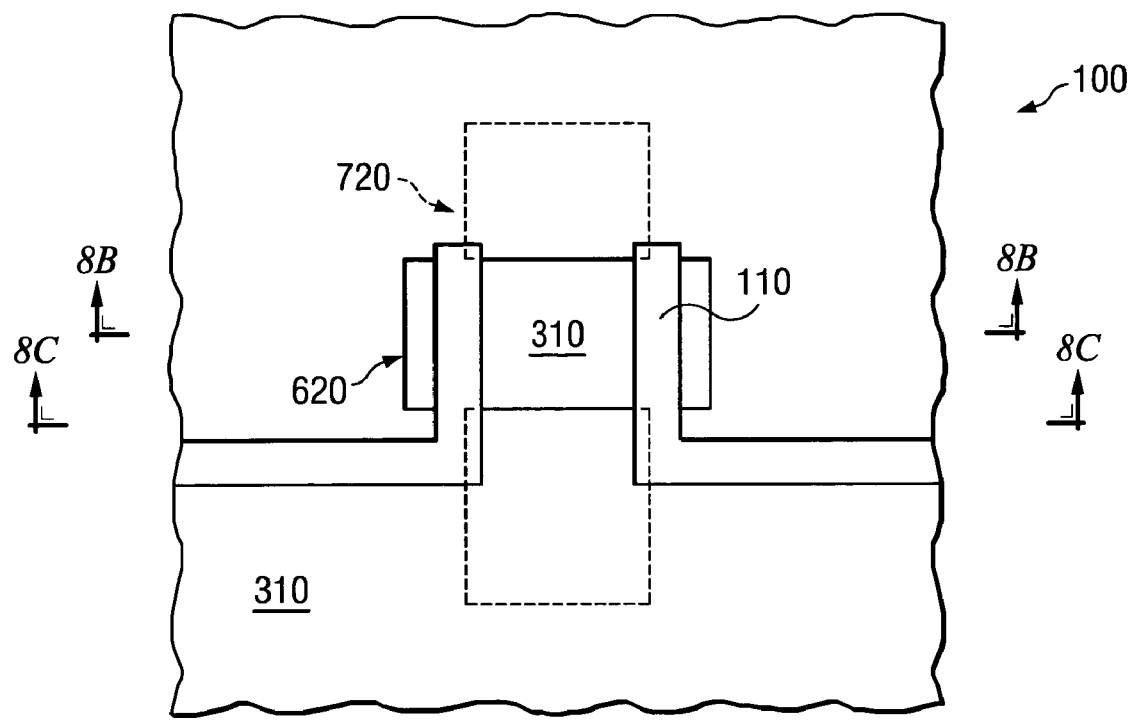
FIGS. 8A through 8C illustrate a plan view and sectional views of the partially completed transistor device illustrated in FIGS. 7A through 7C, respectively, after removing the second photoresist layer.
Figure 8B:
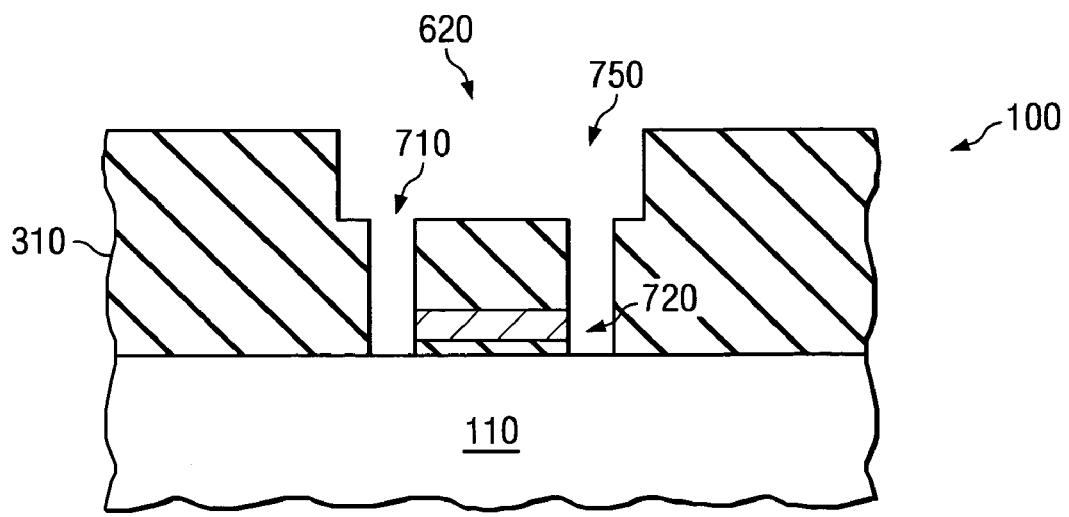
Figure 8C:
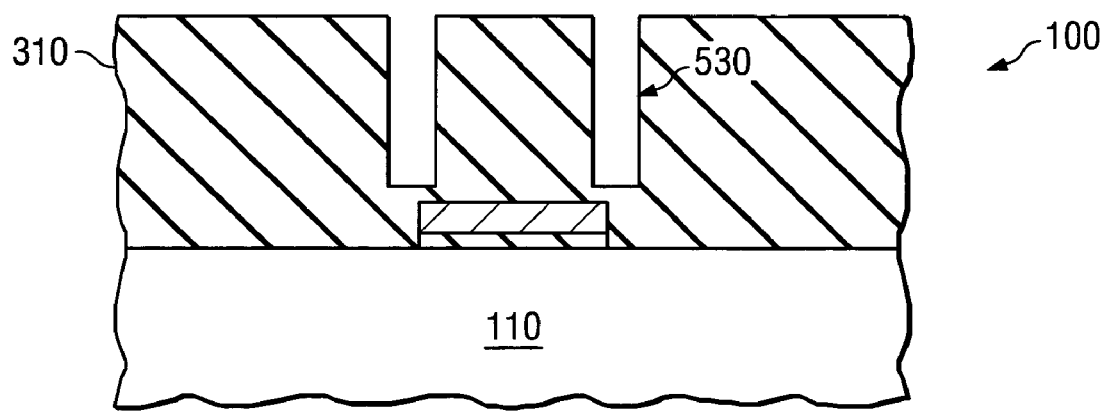

Moving now to FIGS. 8A through 8C, with continued reference to FIG. 7B, illustrated are a plan view and sectional views of the partially completed transistor device 100 illustrated in FIGS. 7A through 7C, respectively, after removing the second photoresist layer 610 by conventional processing. Again, an example of such a removal process is a suitable plasma ash process. Preferably, the process used to remove the second photoresist layer 610 is designed to minimize any adverse reaction, such as sputtering or oxidation, with the exposed substrate 110 at the bottom of the contact openings 710.

Figure 9:
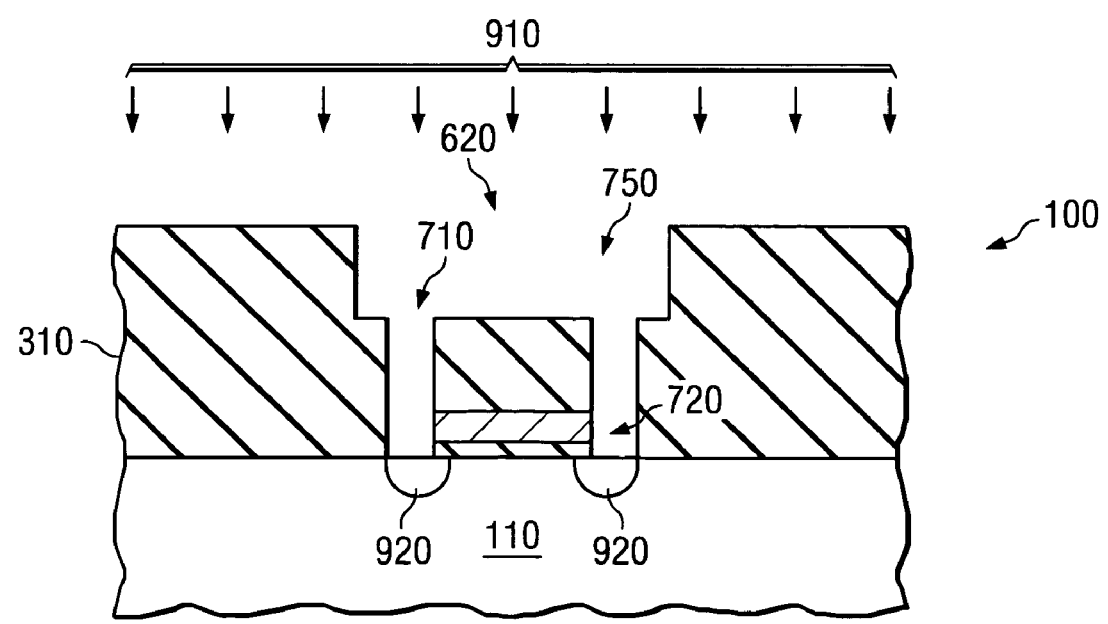
FIG. 9 illustrates a sectional view of the transistor device illustrated in FIG. 8B, during a lightly doped drain (LDD) implant.

Turning to FIG. 9, with continued reference to FIGS. 6B and 7B, the partially completed transistor device 100 of FIG. 8B is illustrated during a lightly doped drain (LDD) implant 910. The LDD implant process 910 is used to introduce dopants into the substrate exposed by the contact openings 710. The LDD implant process 910 results in an LDD dopant profile 920. Those skilled in the art will appreciate that the LDD implant process 910 may be the first of two implants used to define a source and a drain region of a MOSFET device. However, transistor devices requiring fewer or more source/drain implants are within the scope of the invention.

Those skilled in the art will also appreciate that the specific process parameters of the LDD implant process 910 will depend on the nature of the substrate 110 and on the desired properties of the completed transistor device 100. In one embodiment, the substrate 110 is a p-well of a silicon wafer, as would be used to form an n-channel MOSFET device. An n-type dopant such as the Group V elements phosphorus (P) or arsenic (As) may be used for the LDD implant process 910 in this embodiment. Moreover, the particulars of the LDD implant process 910, such as dopant, energy, and dopant concentration, will be selected to result in the desired device performance for the application. In one embodiment, the dopant is As, implanted with an implant energy of about 5 keV to a peak dopant concentration of about $1.6e15\ cm^{-3}$. In another embodiment, the dopant is P, with an implant energy of about 5 keV to a peak dopant concentration of about $1.6e15\ cm^{-3}$. These implant steps are followed by a conventional post-implant damage anneal.

When the substrate is an n-well of a silicon wafer, the doping process instead uses a p-type dopant. One skilled in the art understands that p-type dopants in silicon will generally be selected from Group III of the periodic table, and that generally boron (B) is used. In this embodiment, boron is implanted with an implant energy of about 5 keV to a peak dopant concentration of about $5e14\ cm^{-3}$, again followed by a conventional post-implant anneal.

An angled implant process may be used for the LDD implant process 910. The length 660 of the contact/implant box 620 is relevant with respect to the maximum deviation from normal that the implant current may have. The sides of the contact openings 710 will shadow the implant current in an angled implant process when the implant angle exceeds an angle determined from the height and width of the contact openings 710. The width of the upper opening 750 serves to lower the aspect ratio of the parallel segment 530, reducing the shadowing effect and advantageously increasing the maximum allowed implant angle.

Figure 10A:
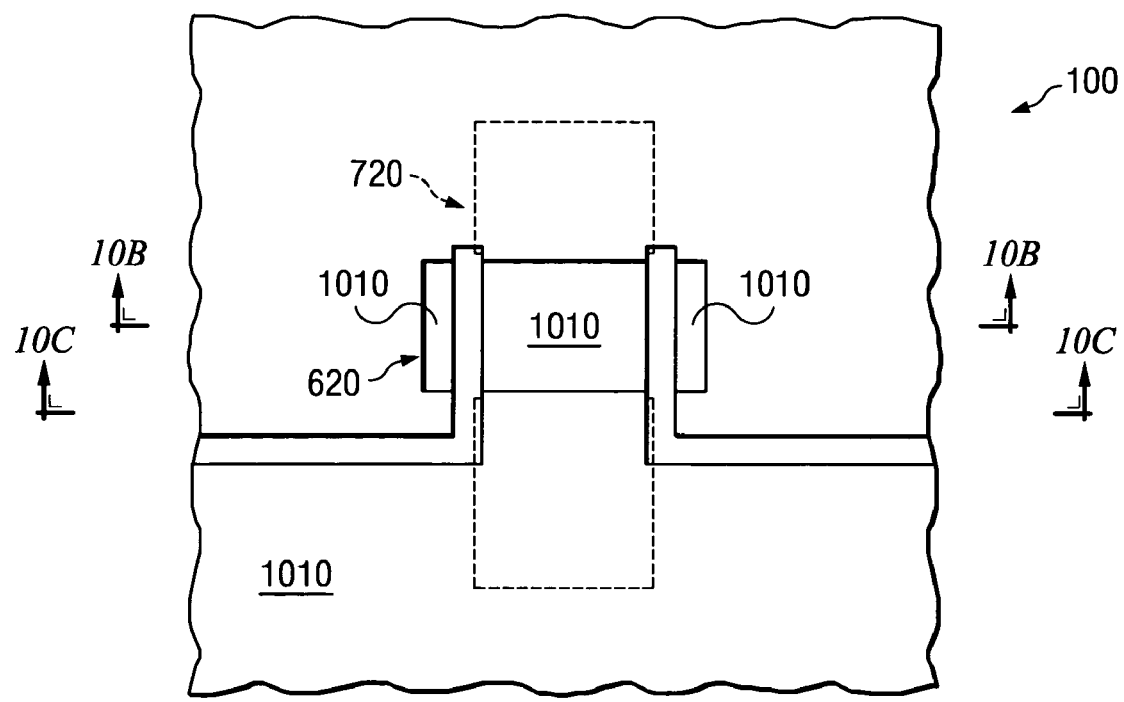
FIGS. 10A through 10C illustrate a plan view and sectional views of the transistor device illustrated in FIG. 9, after forming a spacer.
Figure 10B:
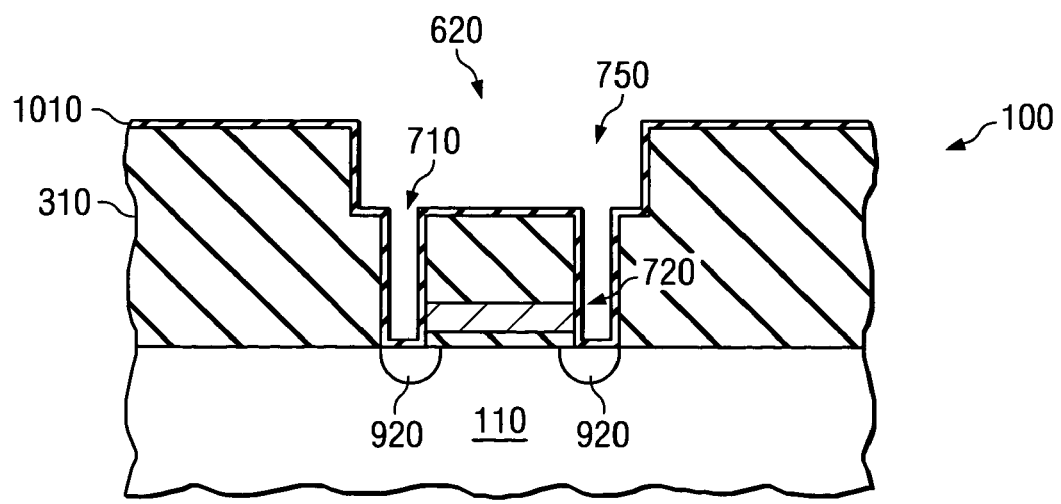
Figure 10C:
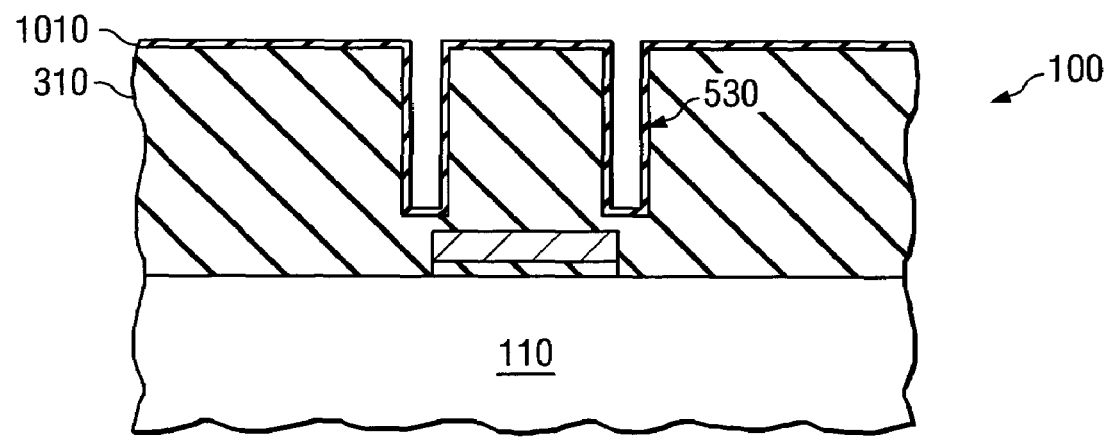

Turning now to FIGS. 10A through 10C, illustrated are a plan view and sectional views of the partially completed transistor device 100 illustrated in FIG. 9 after forming a spacer 1010. The sectional view of FIG. 10B is taken through the contact openings 710, and the sectional view of FIG. 10C is taken through the parallel segment 530 outside the contact/implant box 620. The spacer 1010 has been formed on the exposed horizontal and vertical surfaces of the partially completed transistor device 100 using a conformal process.

Figure 11:
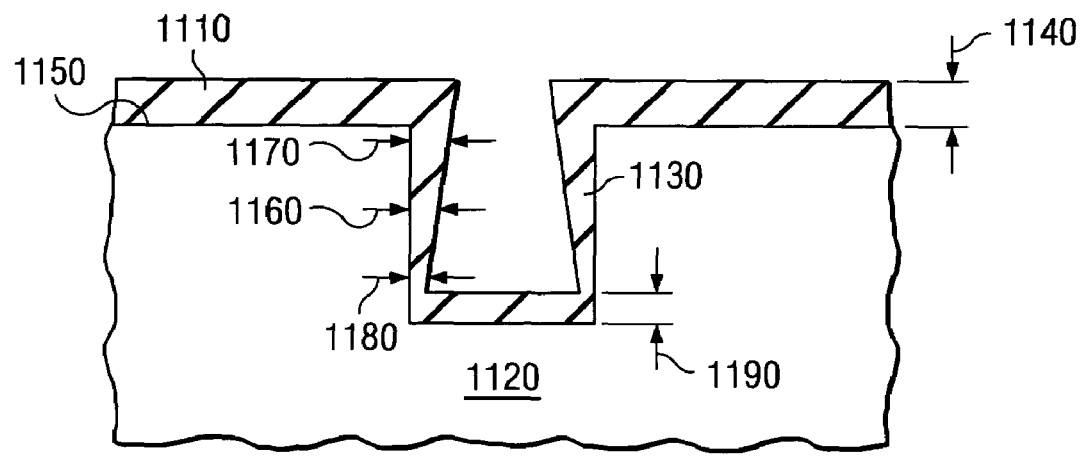
FIG. 11 illustrates a sectional view of a general representation of a conformal layer on a substrate with an opening therein.

Turning briefly to FIG. 11, illustrated is a sectional view of a general representation of a conformal layer 1110 on a substrate 1120 with an opening 1130 therein. A conformal process in the context of the invention is a process that results in a layer 1110 that approximately preserves the cross-sectional profile of the horizontal and vertical surfaces of the substrate 1120 and the opening 1130. One skilled in the art of conformal deposition will appreciate that the layer 1110 may be considered conformal, in spite of departures from ideality. Such departures include: 1) the field thickness 1140 of the layer 1110 on a horizontal surface 1150 of the substrate 1120 may be greater than the average thickness 1160 on a vertical surface of the opening 1130 by about two to three times; 2) the top sidewall thickness 1170 of the layer 1110 may be greater than the bottom sidewall thickness 1180 thereof by as much as about two times; and 3) the bottom thickness 1190 of the layer 1110 at the horizontal bottom of the opening 1130 may be less than the field thickness 1140 by about two to three times.

Returning to FIGS. 10A through 10C, a CVD process may be used, preferably with process variables optimized to ensure complete coverage of the sides of the contact openings 710. The sidewall thickness of the spacer 1010 may range from about 50 nm to about 100 nm, though the thickness may be less than about 50 nm as device geometries shrink in future generations of integrated circuit fabrication technology. The spacer 1010 material may be any conventional or future dielectric material or combination of materials, formed in one or more layers, compatible with the semiconductor manufacturing process that may be conformally deposited. Such materials are well known in the art, and include silicon dioxide, silicon nitride and silicon oxynitride.

Figure 12A:
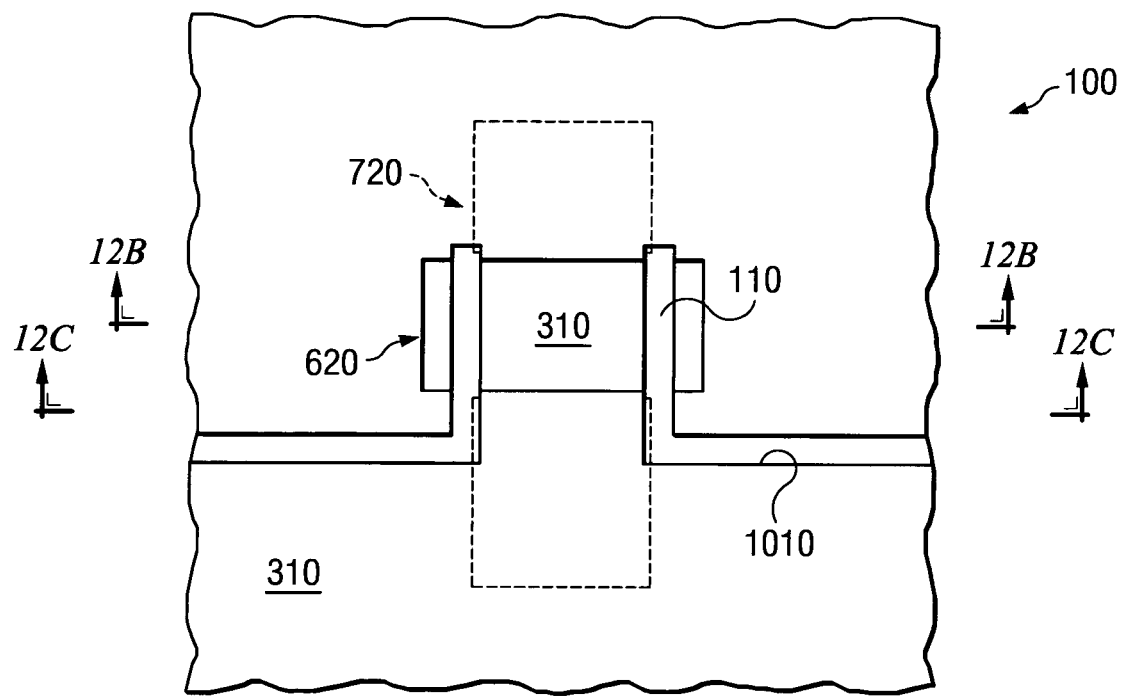
FIGS. 12A through 12C illustrate a plan view and sectional views of the transistor device illustrated in FIGS. 10A through 10C, respectively, after removing a portion of the spacer.
Figure 12B:
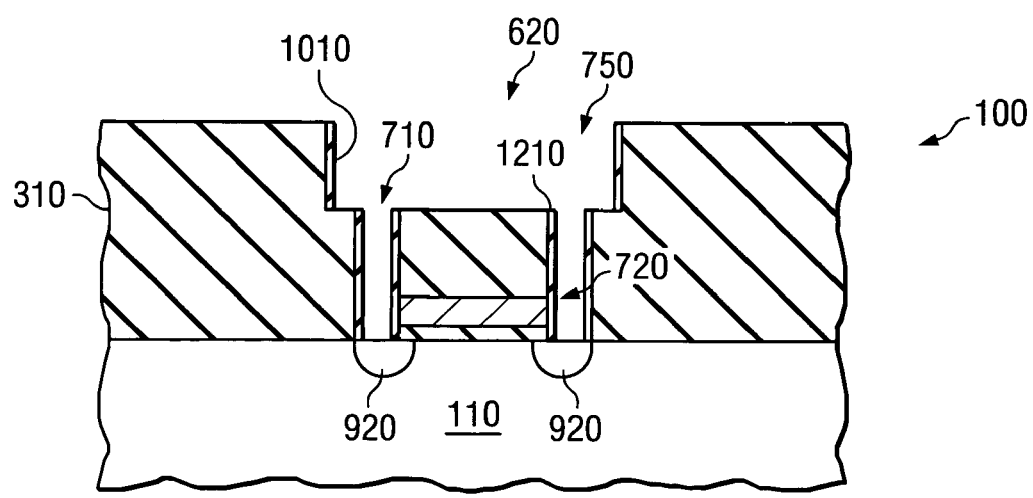
Figure 12C:
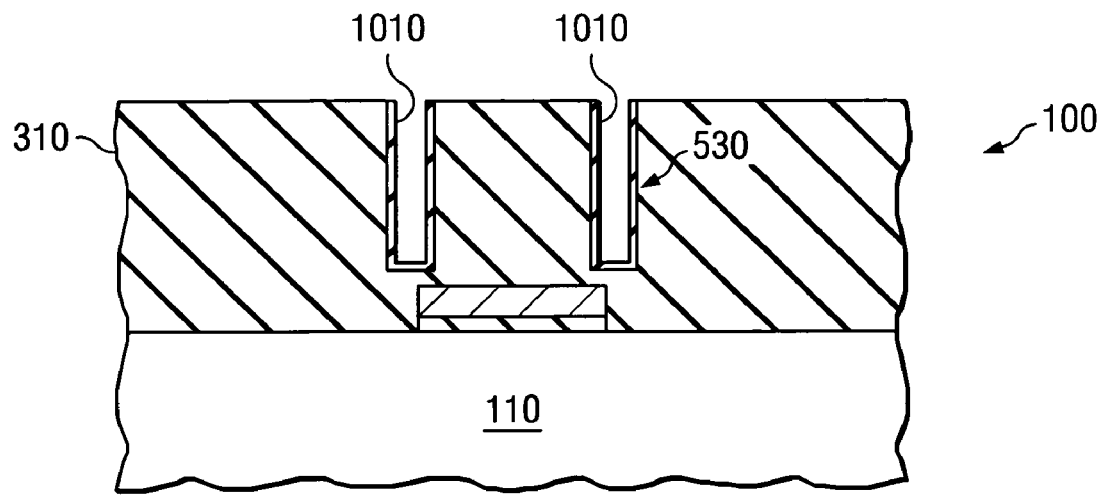

Turning now to FIGS. 12A through 12C, illustrated are a plan view and sectional-views of the partially completed transistor device 100 illustrated in FIG. 10A through 10C, respectively, after removing a portion of the spacer 1010. An anisotropic dielectric etch process has been used to remove the portion of the spacer 1010 at the bottom of the contact openings 710. The etch process may be a conventional plasma etch process, examples of which are well known to those skilled in the art. The process will preferably be designed to remove the spacer 1010 at a relatively greater rate than the substrate 110 so that the etch process will remove essentially all of the spacer 1010 at the bottom of the contact openings 710 without removing a significant portion of the substrate 110.

Those skilled in the pertinent art will appreciate that the anisotropic dielectric etch process may remove material from the corner 1210 at the top of contact opening 710, to produce a rounded or "faceted" corner. For the purpose of the invention, such faceting does not alter the conformal nature of the spacer 710 as previously described in the context of FIG. 11.

Figure 13:
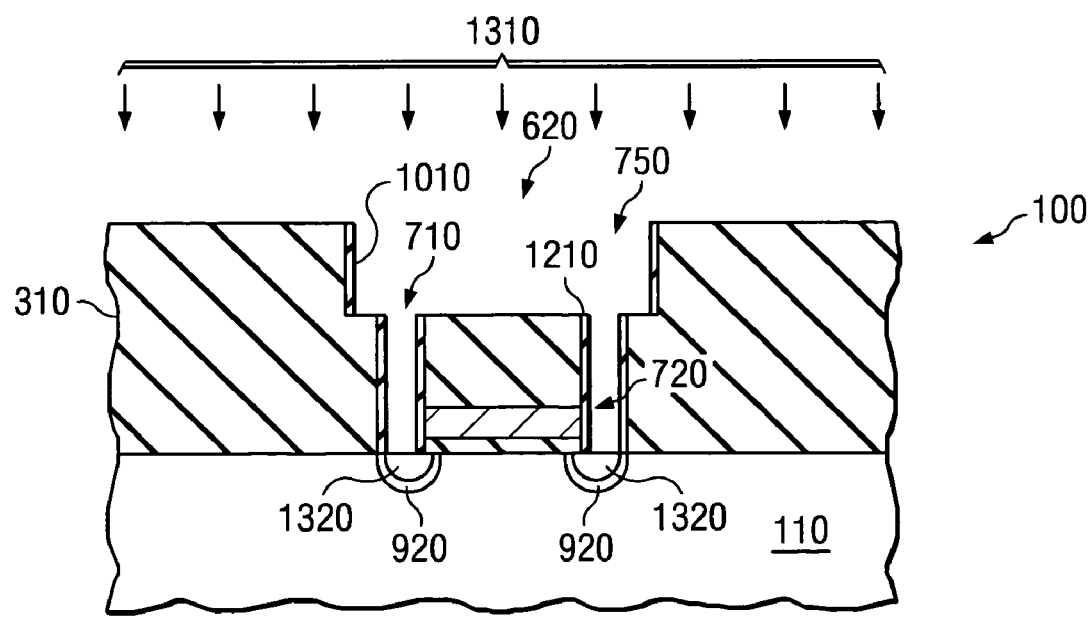
FIG. 13 illustrates a sectional view of the transistor device illustrated in FIG. 12B, during a source/drain implant.

Turning to FIG. 13, the partially completed transistor device 100 of FIG. 11B is illustrated during a source/drain (S/D) implant 1310. The S/D implant process 1310 is used to introduce dopants into the substrate exposed by the contact openings 710. The spacer 1010 acts to offset the S/D implant away from the channel region of the transistor device 100 to result in a desired source/drain implant profile.

Those skilled in the art will appreciate that the specific process parameters of the S/D implant process 1310 will depend on the substrate and on the desired properties of the completed transistor device 100. In one embodiment, the substrate is a p-well of a silicon wafer. A Group V element may be used as an n-type dopant in the S/D implant process 1310. In one embodiment, the dopant is As. In another embodiment, the dopant is P. The implant energy may be about 45 keV, and the peak dopant concentration in the substrate may be about $5.5e13$ cm$^{-3}$.

In another embodiment, the substrate is an n-well of a silicon wafer. A Group III element may be used as a p-type dopant in the S/D implant process 1310. In one embodiment, the dopant is boron. The implant energy may be about 5 keV, and the peak dopant concentration in the substrate may be about $5e9$ cm$^-$. After the source/drain dopant implantation processes, an anneal process may additionally be used to anneal implant damage and diffuse the S/D dopants in the substrate 110. The source/drain implant process 1310 results in a source/drain dopant profile 1320.

Figure 14:
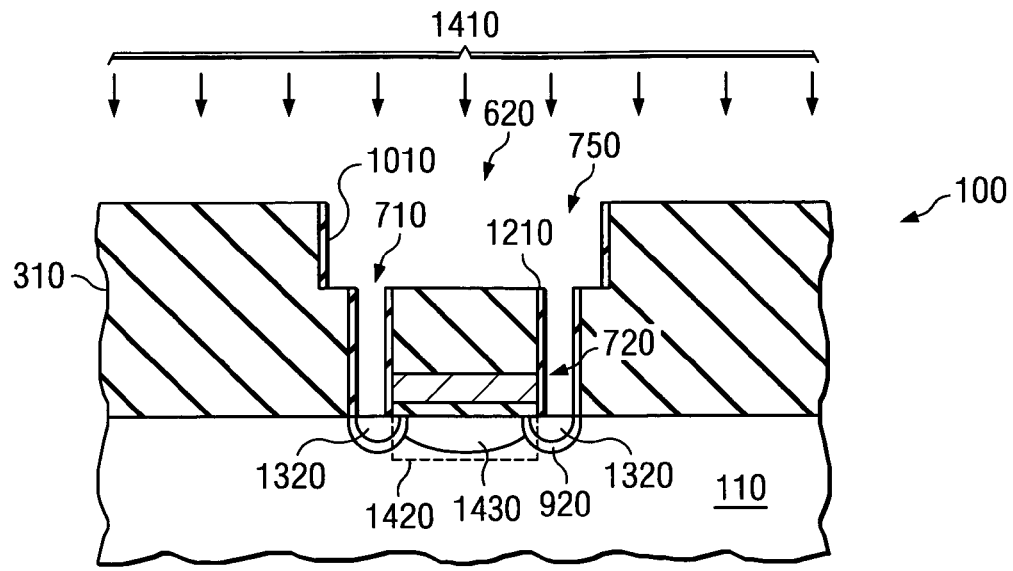
FIG. 14 illustrates a sectional view of the transistor device illustrated in FIG. 13, during a $V_t$ adjust implant.

Turning now to FIG. 14, the partially completed transistor device 100 of FIG. 13 is illustrated during a threshold voltage ($V_t$) adjust implant 1410. The $V_t$ adjust implant 1410 may optionally be used to adjust the work function of the channel of transistor device 100. In one embodiment, the substrate 110 is a p-well of a silicon wafer. Boron or another p-type dopant may be implanted through the patterned gate structure 720 into a channel region 1420 of the transistor device 100. A boron implant energy of about 15 keV may be used to result in a final peak boron concentration in the channel region of about $5e17$ cm$^{-3}$. In another embodiment, the substrate 110 is an n-well of a silicon wafer. Phosphorus, arsenic or another n-type dopant may be implanted through the patterned gate structure 720 into the channel region 1420 of the transistor device 100. An implant energy of 30 keV may be used to result in a final peak dopant concentration in the channel region of about $5e17$ cm$^-$. The $V_t$ adjust implant 1410 results in a channel dopant profile 1430.

Figure 15A:
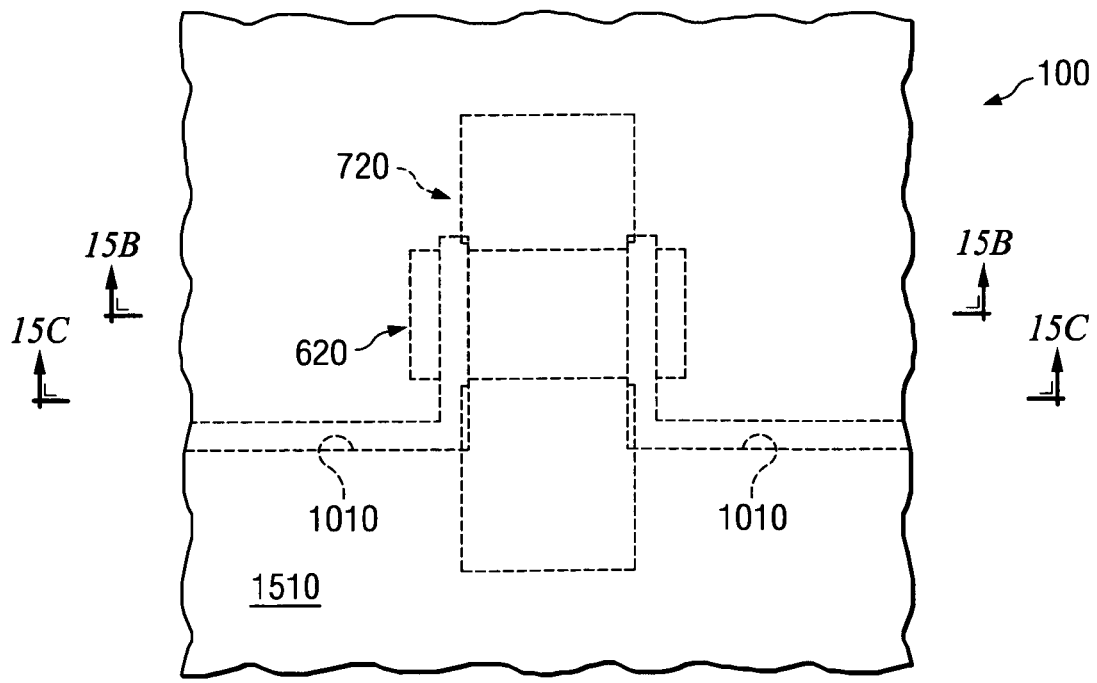
FIGS. 15A through 15C illustrate a plan view and sectional views of the transistor device illustrated in FIG. 14, after filling openings in dielectric with a conductor.
Figure 15B:
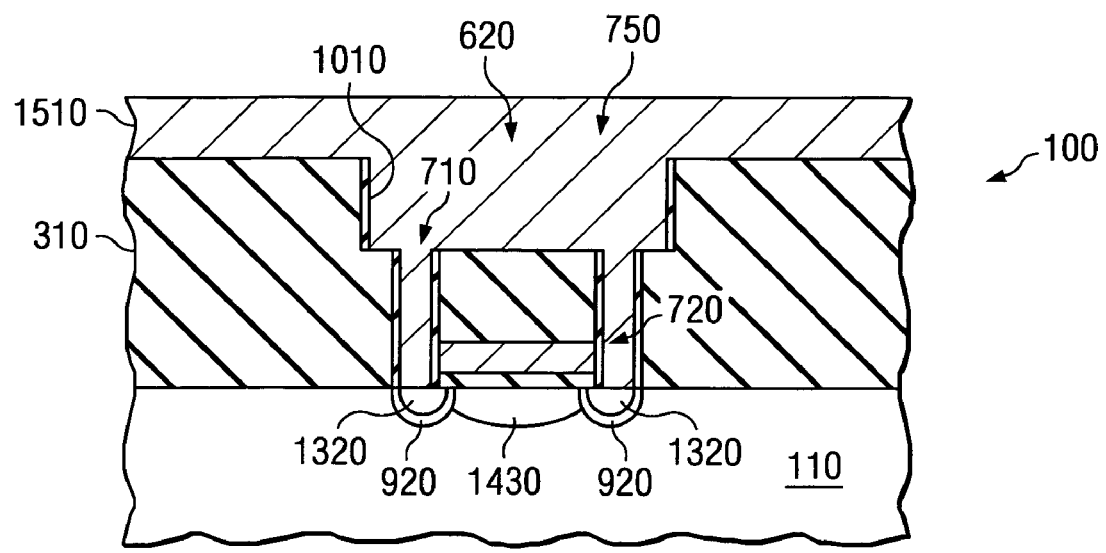
Figure 15C:
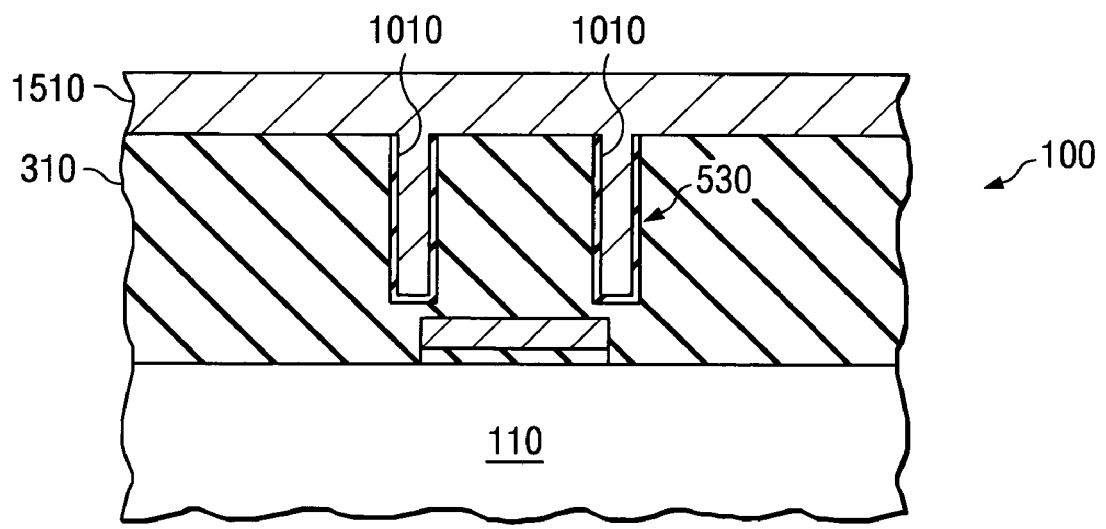

Turning now to FIGS. 15A through 15C, illustrated are a plan view and sectional views of the partially completed transistor device 100 illustrated in FIG. 14 after filling the openings in interlevel dielectric 310 with a conductor 1510. The sectional view of FIG. 15B is taken through the contact openings 710, and the sectional view of FIG. 15C is taken through the parallel segment 530 outside the contact/implant box 620. The parallel segment 530, the anti-parallel segment 540, and the contact openings 710 have been filled with a conductor 1510 using a conventional process to conductively couple to the substrate 110. The conductor 1510 is in direct contact with the spacer 1010, and may include liners, adhesion layers or other layers necessary to integrate the conductor 1510 with the other materials used in the transistor device 100. In one embodiment, a metal silicide may be formed with the substrate 110 exposed at the bottom of the contact openings 710 before filling the contact openings 710 to form an ohmic connection to the substrate 110. In another embodiment, the conductor 1510 is tungsten, which may be deposited by CVD or other suitable conventional process.

Figure 16A:
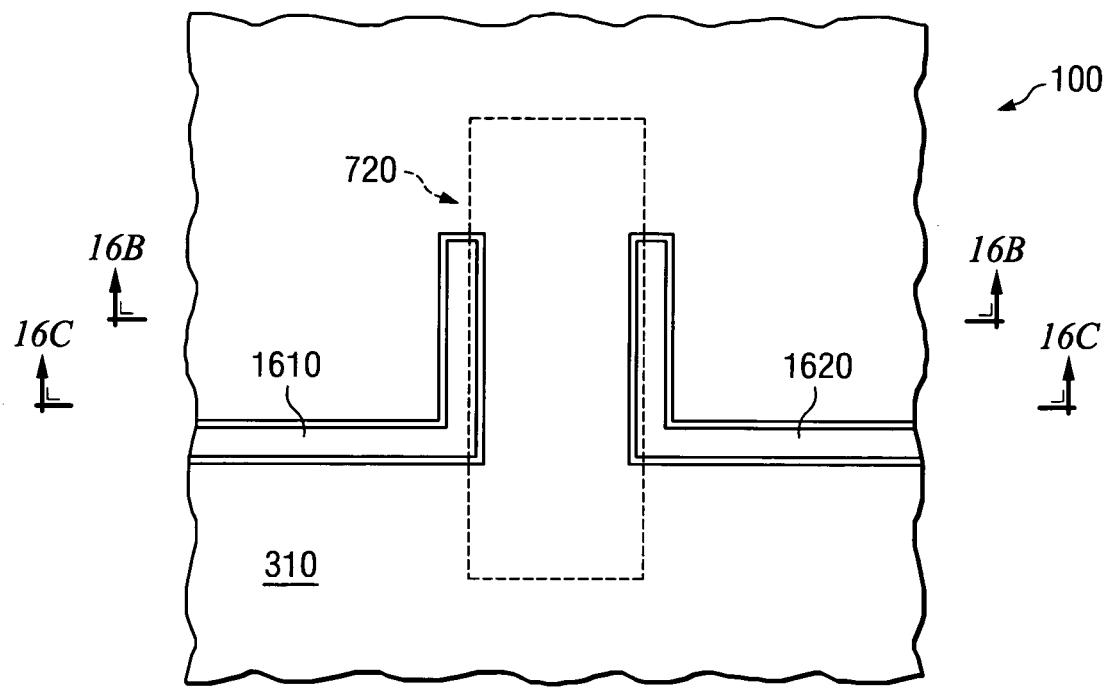
FIGS. 16A through 16C illustrate a plan view and sectional views of the transistor device illustrated in FIGS. 15A through 15C, respectively, after removing a portion of the conductor and the interlevel dielectric to form a source contact and a drain contact.
Figure 16B:
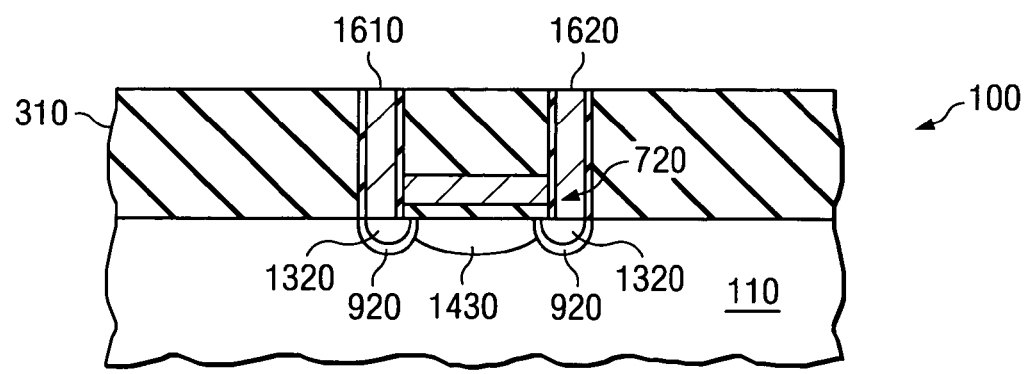
Figure 16C:
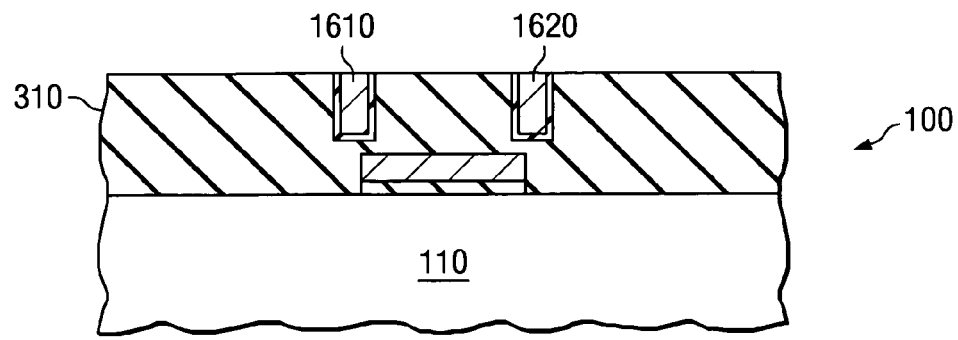

Turning to FIGS. 16A through 16C, illustrated are a plan view and sectional views of the partially completed transistor device 100 illustrated in FIGS. 15A through 15C, respectively, after removing a portion of the conductor 1510 and the interlevel dielectric 310 to form a source contact 1610 and a drain contact 1620. The conductor 1510 and the interlevel dielectric 310 may be removed by a conventional process such as chemical mechanical polishing (CMP). The CMP process preferably removes the conductor 1510 relatively faster than the interlevel dielectric 310, providing for the ability to stop the process after removing the conductor 1510 from the top surface of the interlevel dielectric 310. Those skilled in the art are familiar with designing a CMP process to meet this objective.

The method of manufacturing the transistor device 100 set forth herein advantageously provides for the formation of the source contact 1610 and the drain contact 1620 without the need of a patterning step that requires alignment of a contact pattern to a gate of the transistor device 100, as required by prior art methods. Because alignment uncertainty requires providing a nonzero alignment tolerance when referencing a later pattern level to an earlier pattern level, the inventive method relaxes the requirements on the alignment by self-aligning the source contact 1610 and the drain contact 1620 to the gate of transistor device 100. Thus, the size of the transistor device 100 may be reduced relative to the prior art, and the demands on the more expensive and slower lithographic tools may be reduced, decreasing the cost of production.

The source contact 1610 or the drain contact 1620 may be designed to provide a landing pad for a via connection to a higher interconnect level (not shown) of a completed integrated circuit. The source contact 1610 or the drain contact 1620 may also be used to provide local interconnections to neighboring transistor devices 100. An integrated circuit design may utilize these embodiments separately or in combination.

Figure 17:
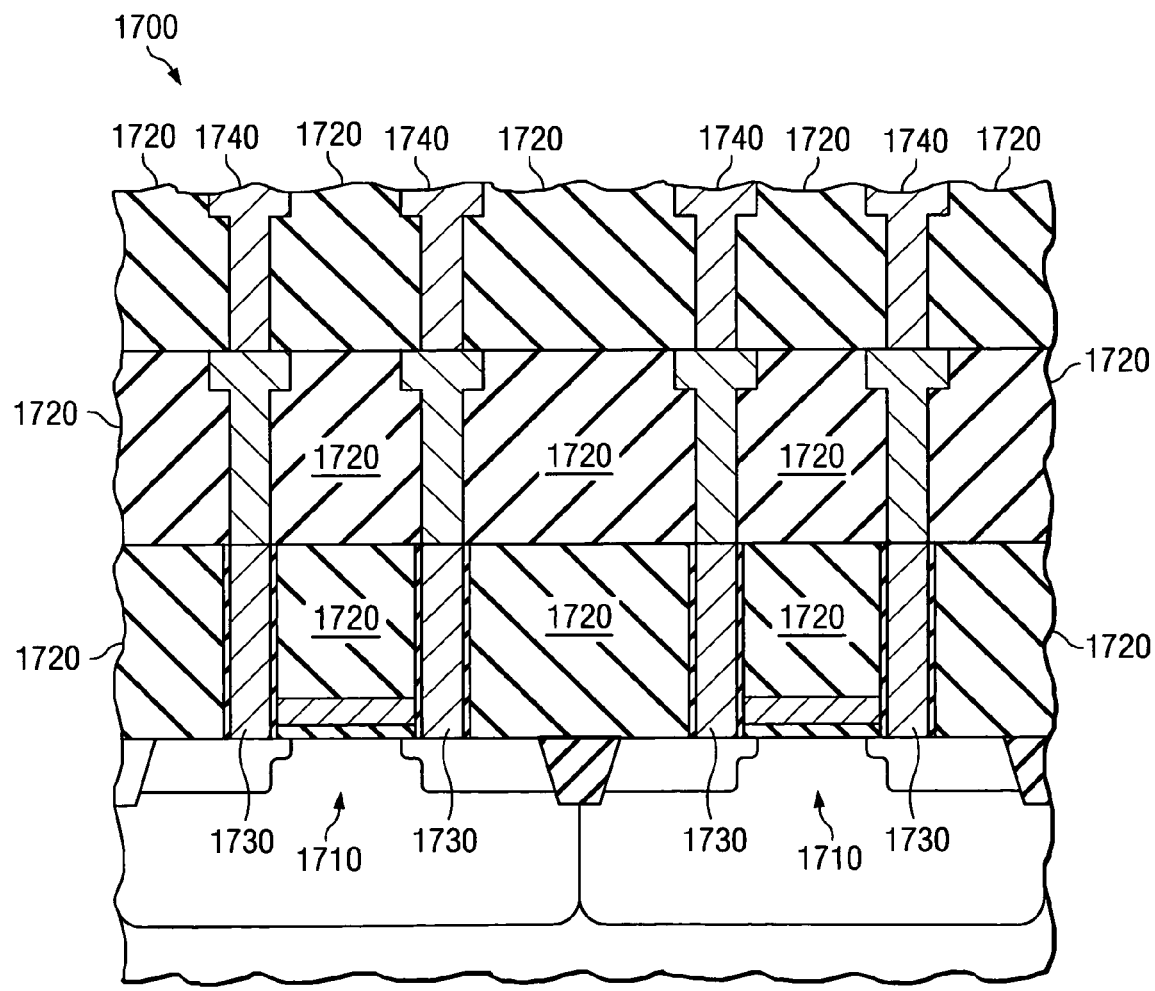
FIG. 17 illustrates an exemplary sectional view of an integrated circuit (IC) incorporating transistor devices, each manufactured according to the principles of the present invention.

Finally, turning to FIG. 17, illustrated is an exemplary sectional view of an integrated circuit (IC) 1700 incorporating transistor devices 1710, each manufactured according to the principles of the present invention. The IC 1700 may include MOS or BiCMOS components, and may further include passive components, such as capacitors, inductors or resistors. It may also include optical components or optoelectronic components. Those skilled in the art are familiar with these various types of components and their manufacture.

Dielectric layers 1720 are fabricated over the transistors 1710 using conventional means. Additionally, contacts 1730 and interconnect structures 1730 are located within the dielectric layers 1730 to interconnect various components, thus forming the operational integrated circuit 1700. It will be apparent to one skilled in the art that several variations of the exemplary interconnect architecture may be fabricated according to the principles of the invention with similarly advantageous results.

Although the present invention has been described in detail, those skilled in the art should understand that they may make various changes, substitutions and alterations herein without departing from the spirit and scope of the invention in its broadest form.

What is claimed is:

1. A method for manufacturing a transistor device, comprising:

providing a gate structure over a substrate;

forming an insulating layer over said gate structure;

forming an opening in said insulating layer to said substrate, said forming removing a portion of said gate structure proximate said substrate;

filling said opening with a conducting material thereby forming an interconnect; and wherein said removing said portion of said gate structure defines a gate length of said gate structure.

2. The method as recited in claim 1 further including forming a conformal liner within said opening and along a sidewall of said gate structure.

3. The method as recited in claim 1 further including implanting source/drain regions through said opening in said insulating layer.

4. The method as recited in claim 1 further including implanting a threshold adjustment implant through said opening in said insulating layer.

5. The method as recited in claim 1 wherein said forming said opening in said insulating layer includes providing a first patterned photoresist layer over said insulating layer and etching into but not through said insulating layer, and providing a second patterned photoresist layer over said insulating layer and etching through said insulating layer to said substrate.

6. The method as recited in claim 5 wherein said first patterned photoresist layer has a narrow opening and said second patterned photoresist layer has a wider opening.

7. The method as recited in claim 6 wherein etching using the first patterned photoresist layer occurs before etching using the second patterned photoresist layer.

8. A method for manufacturing an integrated circuit, comprising:
    forming transistor devices over a substrate, including:
    providing gate structures over said substrate;
    forming an insulating layer over said gate structures;
    forming openings in said insulating layer to said substrate, said forming removing a portion of each of said gate structures;
    filling said openings with a conducting material thereby forming interconnects;
    fabricating interlevel dielectric layers over said transistor devices, said interlevel dielectric layers having conductive features for contacting the transistor devices and forming an operational integrated circuit; and
    wherein said removing said portion of each of said gate structures defines a gate length of each of said gate structures.

9. The method as recited in claim 8 further including forming a conformal liner within said openings and along a sidewall of said gate structures.

10. The method as recited in claim 8 further including implanting source/drain regions through said openings in said insulating layer.

11. The method as recited in claim 8 wherein said forming said openings in said insulating layer includes providing a first patterned photoresist layer over said insulating layer and etching into but not through said insulating layer, and providing a second patterned photoresist layer over said insulating layer and etching through said insulating layer to said substrate.

12. The method as recited in claim 11 wherein said first patterned photoresist layer has two or more narrow openings and said second patterned photoresist layer has two or more wider openings.

* * * * *